United States Patent [19]
Josephson et al.

[11] Patent Number: 5,331,590
[45] Date of Patent: Jul. 19, 1994

[54] SINGLE POLY EE CELL WITH SEPARATE READ/WRITE PATHS AND REDUCED PRODUCT TERM COUPLING

[75] Inventors: Gregg R. Josephson, Aloha; Douglas H. Bower, Beaverton; David L. Tennant, Salem, all of Oreg.

[73] Assignee: Lattice Semiconductor Corporation, Hillsboro, Oreg.

[21] Appl. No.: 777,769

[22] Filed: Oct. 15, 1991

[51] Int. Cl.[5] .............................................. G11C 11/40
[52] U.S. Cl. .................................... 365/182; 365/185; 365/187; 365/188; 257/239; 257/314; 257/315
[58] Field of Search ............... 365/182, 185, 187, 188, 365/239, 314, 315

[56]  References Cited
U.S. PATENT DOCUMENTS

| | | | |
|---|---|---|---|
| 4,663,740 | 5/1987 | Ebel | 365/185 |
| 4,695,979 | 9/1987 | Tunell et al. | 365/185 |
| 4,870,615 | 9/1989 | Maruyama et al. | 365/185 |
| 4,912,534 | 3/1990 | Tanaka et al. | 365/185 |
| 4,935,648 | 6/1990 | Radjy et al. | 365/185 |
| 4,982,377 | 1/1991 | Iwasa | 365/185 |

Primary Examiner—Eugene R. LaRoche
Assistant Examiner—Viet Q. Nguyen
Attorney, Agent, or Firm—Skjerven, Morrill, MacPherson, Franklin and Friel

[57] ABSTRACT

A single poly EE cell and an array using said cell, with the array being provided electrical connections such that the select gate for the read select transistor and the select gate for the write select transistor may be separately controlled. In the array, first level metal is utilized for connection to the gates of the read and write select transistors and second level metal is utilized for connection to the product term connections of the cell.

4 Claims, 15 Drawing Sheets

METAL 1

METAL 2

METAL TO POLYSILICON CONTACT

METAL TO METAL CONTACT

BOUNDERIES OF POLYSILICON

BOUNDERIES OF DIFFUSION

METAL TO DIFFUSION CONTACT

SINGLE POLY EE CELL WITH SEPARATE READ/WRITE PATHS AND REDUCED PRODUCT TERM COUPLING

BACKGROUND OF THE INVENTION

1. Field of the Invention

The present invention relates to electrically erasable and programmable read only memory (EEPROM) cells, and more particularly to single poly EEPROM memory cells and an array using such cells in which the cells are connected to provide a faster read and write performance with reduced product term coupling.

2. Description of the Prior Art

Single poly EEPROM cells are known in the prior art and arrays using such cells are also known. Typical prior art circuits are illustrated in FIGS. 1 and 2. Referring to FIG. 1, the cell disclosed therein was described in an IEEE paper entitled "A Family of High Performance CMOS Programmable Logic Devices Using a Single Polysilicon Electrically Erasable Floating Gate Cell" by John Turner, presented at the 10th IEEE Non-Volatile Workshop, Aug. 14–16, 1989. Referring to FIG. 1, the Turner memory cell is comprised of memory transistor MC1, write transistor TW1 and read transistor TR1. Memory transistor MC1 of FIG. 1 is of the single poly type, that is, only the floating gate of polycrystalline silicon is utilized, and the control gate consists of a diffusion in the substrate below the floating gate. The write gate (WG) is effectively a portion of a diffusion of write transistor TW1, which is of course also in the substrate. It will be appreciated by reference to FIG. 1, that the select gate for both the write and read transistors are commonly connected to select line SL1. When performing either a write or read operation, the potential is provided to the select gates over select line SL1 with appropriate potentials being applied to the other terminals of the cell. When the cell is utilized in its typical environment, which is as part of a large array of cells, each of the select gates in a row of memory cells are commonly connected to the select line for that row. Since all of the select gates for the write and read transistors in a row are coupled to the same line, a significant amount of capacitance is seen by the select line and accordingly when either a write or a read operation is to be performed, a delay in its performance results because of the significant amount of capacitance which results from having all of the select gates coupled to the same line.

Another single poly EEPROM cell is schematically illustrated in FIG. 2. This cell was reported on in a paper entitled "A 20 ns CMOS Programmable Logic Device for Asynchronous Applications", by Jagdish Pathak et al. in the 9th IEEE Non-Volatile Semiconductor Memory Workshop, Feb. 22–24, 1988 in Monterey, Calif. Referring to FIG. 2, the Pathak et al. cell includes memory cell transistor MC2, write transistor TW2 and read transistor TR2. In the memory cell illustrated in FIG. 2, the select gates of both the write transistor and read transistor are commonly connected to select line SL2. Thus it will be apparent by comparison of the schematics in FIG. 1 and FIG. 2, that the select gates for the cells are commonly connected. Accordingly, when a read or a write operation is to be performed, appropriate potential is applied to select line SL2, and potentials are applied to other terminals of the cell at the required levels to perform either a read or a write operation. Memory cell in FIG. 2 suffers from the same operational problems associated with the cell in FIG. 1 with respect to speed. Since all of the select gates on a row are commonly coupled, a speed degradation problem occurs in the same manner as described above with respect to the circuit of FIG. 1.

Other disadvantages of prior art single poly EE cells reside in the manner in which the first and second level metals are connected to the product term terminals of the read and write transistors and the connection from the select gates and the metallization to which the select gates are connected. More particularly, in prior art devices the second level metal is connected to the select gates and straps are used between the second level metal and the select gates at periodic intervals to provide reduced resistance in the select gate path. The first level metal in a prior art cell of this type is connected to the product term terminals of the cell (WRITE PT and READ PT). This utilization of first and second level metals results in what is known as the "sandwich effect" since the second metal (which is of course above the first level metal) and the poly select gates which are below the first level metal effectively result in a sandwich of those two conductors on opposite sides of the first level metal. This "sandwich" construction adds additional row to product term capacitance in the select lines which results in a slower speed read operation. Additionally, since first level metal is used for connection to the product term terminals, the relative proximity between first level metal and the substrate results in capacitance which decreases the speed with which a read operation may be performed when contrasted to the present invention in which second level metal is used for the product terms.

Another cell of the prior art is described in a paper entitled "A High Performance CMOS EEPAL Cell" by Nader Radjy et al. which was presented at the 9th IEEE Non-Volatile Semiconductor Memory Workshop, held Feb. 22–24, 1988 in Monterey, Calif. The cell described in the paper differs from the cell of the present invention in that the cell described in the paper is a double poly cell, and secondly, first level metal is utilized for connections to the product term terminals. The latter construction of course results in the undesirable increase in capacitance described above. Additionally, although the Radjy et al. description indicates that a separate select line is utilized for read and write select gates, since the cell is double poly, it is significantly more complicated to manufacture.

SUMMARY OF THE INVENTION

It is an object of the present invention to provide a single poly semiconductor memory array having increased speed of operation for the read function. Another object of the present invention is to provide a semiconductor memory array in which the coupling effect between the row conductors and the product term lines in the array is reduced to avoid interfering with the read operations of the memory cells.

In accordance with the present invention, a single semiconductor memory array is provided in which a read select transistor and a write select transistor are coupled to a memory transistor to provide separate read and write paths for the cell, and separate connections are provided to the gates of the read and write transistors.

In accordance with another feature of the present invention, the select gates of the read and write transistors are coupled to first level metal in the array and the second level metal is used to connect the product term lines to the semiconductor regions of the transistors in the array.

BRIEF DESCRIPTIONS OF THE DRAWINGS

Other objects and advantages of the invention will become apparent from a study of the specification and drawings in which.

Figure 5:
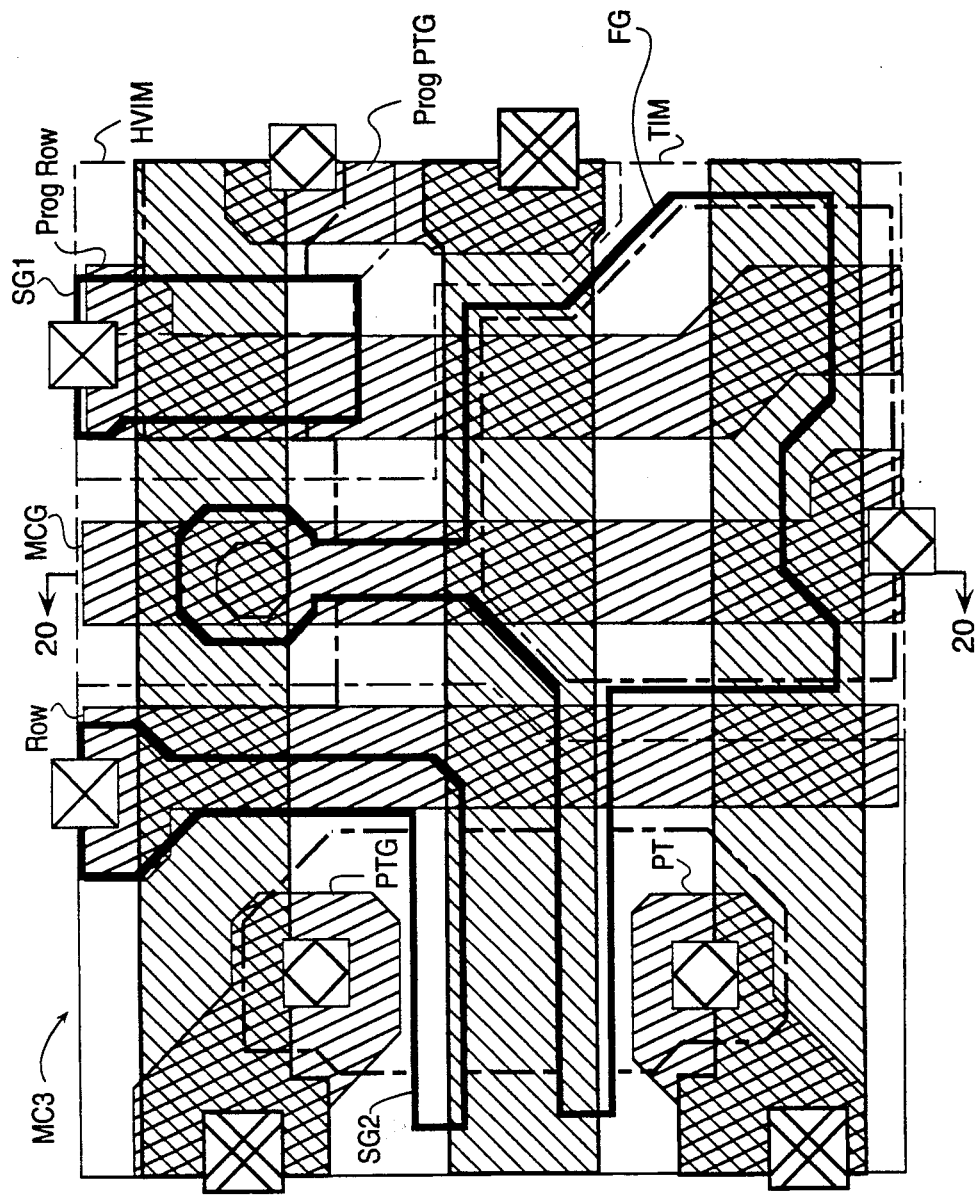
FIG. 5 is a top plan view illustrating the layout of a semiconductor memory cell in accordance with the present invention.

FIGS. 7-10 illustrate various levels of the memory cell beginning with the substrate and going up through the second metal, the combination of which result in the memory cell as illustrated in FIG. 5; and FIGS. 11-20 illustrate the steps in the preferred process for producing a memory cell in accordance with the present invention, as well as providing illustrative cross-sectional views of various portions of the cell.

DETAILED DESCRIPTION OF THE INVENTION

Figure 1:
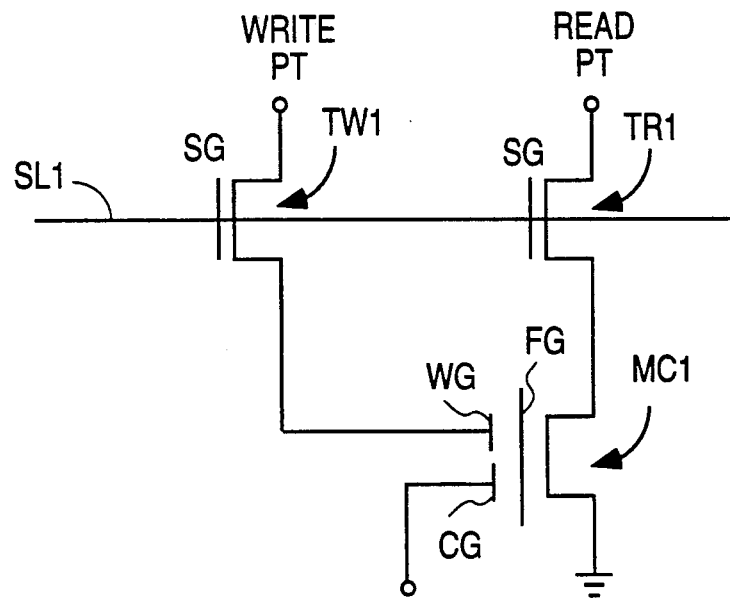
FIGS. 1 and 2 illustrate prior art single poly EE semiconductor memory cells.
Figure 2:
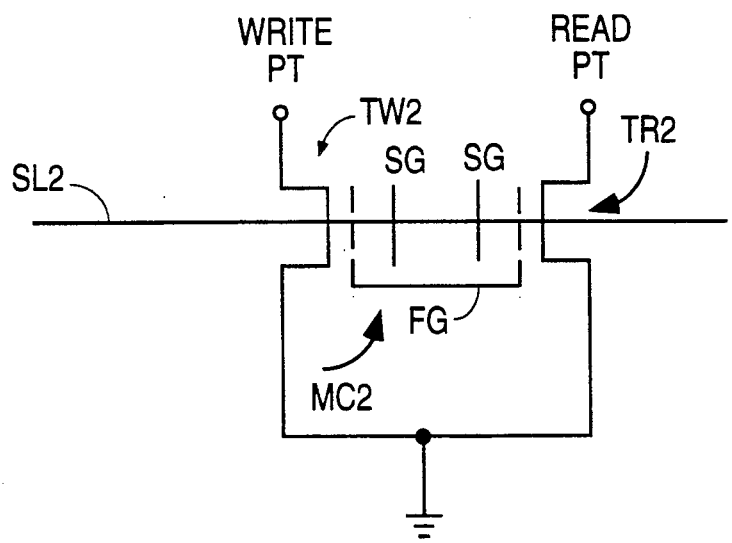
Figure 3:
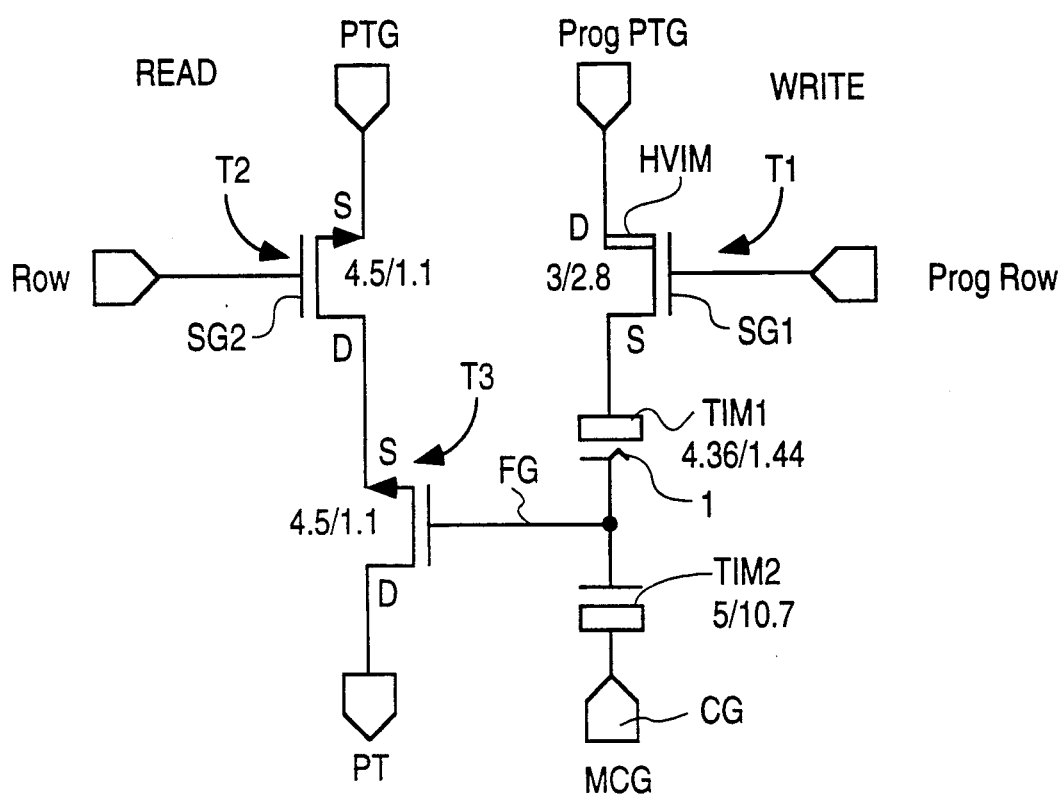
FIG. 3 illustrates schematically a semiconductor memory cell in accordance with the present invention.

Referring to FIG. 3, memory cell MC3 in accordance with the present invention is disclosed partly schematically and in part with semiconductor region representations. For ease in understanding the cell and corresponding it with the memory cell layouts in subsequent figures, the orientation of the transistors in the circuit of FIG. 3 corresponds to the orientation of the transistors in FIG. 5 and other Figures illustrating the layout of the memory cell. Memory cell MC3 is comprised of electrically programmable and erasable memory transistor T3 which includes a floating gate, indicated by FG, and source and drain terminals indicated respectively by S and D. The pair of numbers separated by a slash adjacent to each of the transistors is used to indicate the preferred channel width to length ratio. It will of course be appreciated that other ratios may be utilized, and the present invention is not limited to the particular ratios illustrated in the description. The drain terminal of memory transistor T3 is connected to terminal PT. Memory transistor T3 is programmed to be either conductive or nonconductive, which is also referred to by some companies working in this art and is used herein as the "programmed" or "erased" state respectively, by applying appropriate potentials to the terminals of memory cell MC3 and through the use of the write path which includes write select transistor T1. One region of write select transistor T1 includes high voltage implant, indicated by HVIM in FIG. 3. This region of write select transistor T1 is connected to terminal Prog PTG. The conduction of write select transistor T1 is controlled by its select gate, indicated by SG1 in the figure, which is connected to terminal Prog Row. As will best be appreciated by reference to the structural figures in the specification, floating gate FG of memory transistor T3 includes a portion which extends adjacent to region TIM1 (a tunnel implant region) which in conjunction with portion 1 of the floating gate, which is separated from the tunnel implant TIM1 by a tunnel oxide, which permits the program and erase of memory transistor T3 using Fowler Nordheim tunnel program/erase concept which is well know to those skilled in the art. The control gate function for memory transistor T3 is provided by tunnel implant TIM2, which is a region in the body of semiconductor material in which the cell is located. Region TIM2 in the semiconductor body is connected to terminal MCG, which is the memory control gate terminal. The floating gate is separated from tunnel implant TIM2 by suitable oxide which will be described hereinafter in connection with the process for making the cell.

To read the state (either conducting or nonconducting) of memory transistor T3, a second path, which includes read select transistor T2, is utilized. The source of read select transistor T2 is connected to terminal PTG, the drain of transistor is connected to the source of memory transistor T3, and the select gate SG2 of read select transistor T2 is coupled to terminal Row. As will be appreciated by those skilled in the art, the utilization of separate read and write paths for the memory cell permits the optimization of the elements in each path to provide maximum speed and programming capabilities.

In operation, the write path, which includes write select transistor T1, is utilized to perform both the program and erase functions. In some instances this path is referred to as the program path, however the "write path" terminology is used herein since both program and erase functions are performed using the "write path". The table below indicates the voltages which are applied to the terminals of memory cell MC3 for performing the Erase, Program, Verify and Normal functions for the memory cell. As used herein, Normal is equivalent to the Read function for the cell.

| Terminal | Erase | Program | Verify | Normal |
|---|---|---|---|---|
| ProgRow | Vcc−2Vtn | Vpp+Vtn | Vcc−Vtn | Vcc−2Vtn |
| ProgPTG | 0 | Vpp | 0 | 0 |
| PTG | 0 | 0 | 0 | 0 |
| PT | Vtn | Vtn | Vtn | Vtn |
| Row | Vcc−2Vtn | Vcc−Vtn | Vcc−Vtn | Vcc/Ground |
| MCG | Vpp | −Vtn | Vtn | Vtn |

In the above table, and for the operations of the cell, the program voltage Vpp is equal to approximately 14.5 volts, Vcc is equal to approximately 5 volts and Vtn is used to indicate the threshold voltage of an N-channel device, which is approximately 1 volt. The preferred implementation of memory cell MC3 utilizes N-channel devices, although it would of course be possible to construct a memory cell using P-channel devices, although its operation would be less desirable than the N-channel implementation. In FIG. 3, the numerical notation separated by slash adjacent to tunnel implant TIM1 and the notations adjacent to tunnel implant TIM2 indicate width by length ratio, however the area ratio is the important feature.

Figure 6:
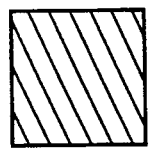
FIG. 6 illustrates the graphic symbols utilized in the drawings of FIGS. 5 and 7-10 to indicate the various structural elements of the memory cell.
Figure 6:
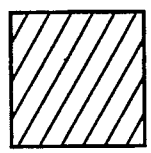
Figure 6:
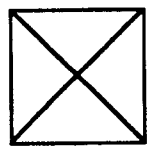
Figure 6:
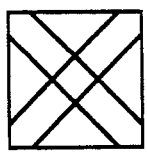
Figure 6:
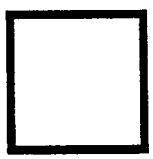
Figure 6:
Figure 6:
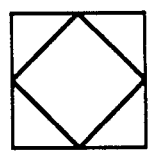
Figure 7:
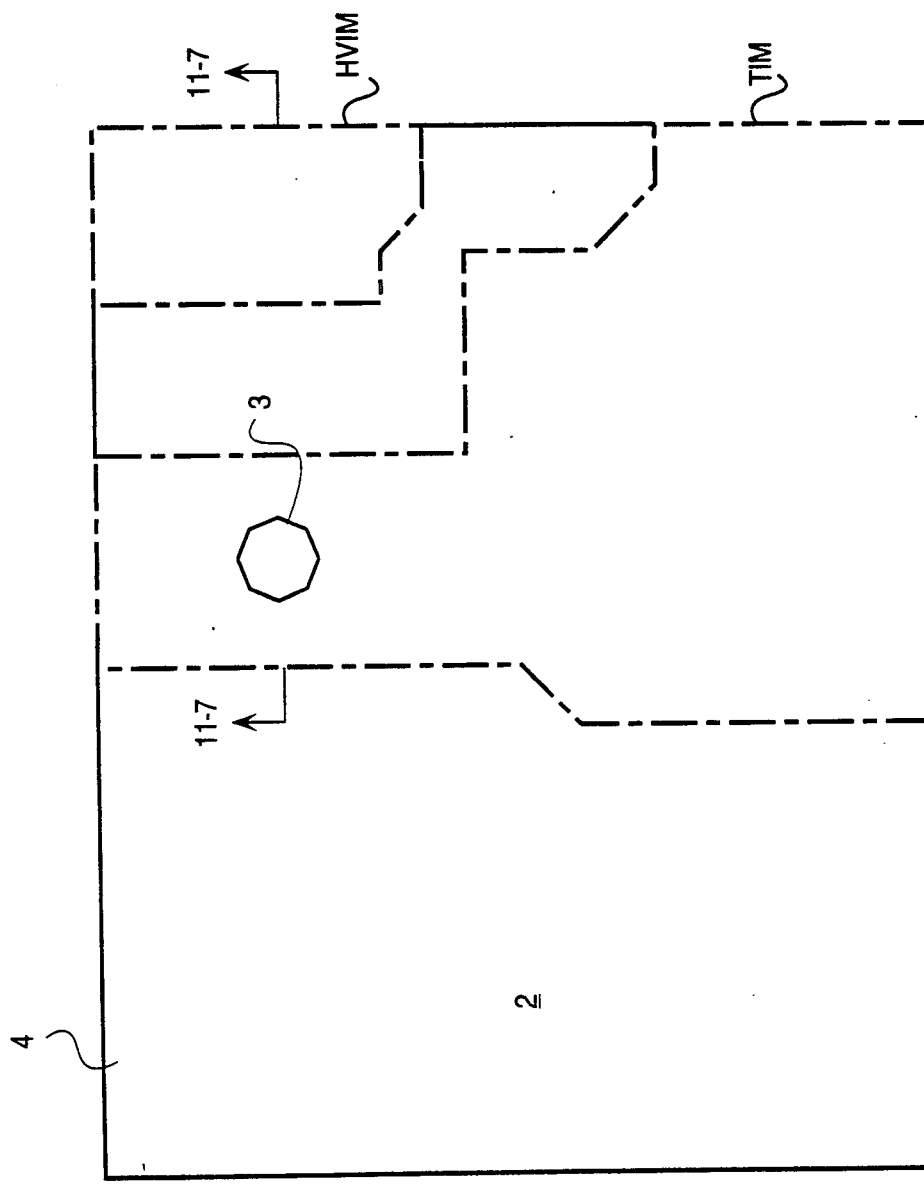

The preferred layout of memory cell MC3 is illustrated in FIG. 5. In FIG. 6, the key to the identification of the portions of memory cell MC3 is indicated to facilitate the understanding of the drawing figures. Consistent notations are utilized in FIGS. 7-10 are used to illustrate various levels in the structure of memory cell MC3. Referring to FIG. 7, high voltage implant HVIM in semiconductor body material 2 is illustrated. The tunnel implant TIM2 is also illustrated in a spaced apart relationship from HVIM. Tunnel oxide 3 is also illustrated above tunnel implant TIM2. Tunnel oxide 3 extends above surface 4 of semiconductor body 2 and separates extension 1 of floating gate FG from surface 4 of the semiconductor body. As noted previously, the program and erase of memory transistor T3 is accomplished through Fowler-Nordheim tunneling from extension 1 of the floating gate to tunnel implant TIM1.

Figure 8:
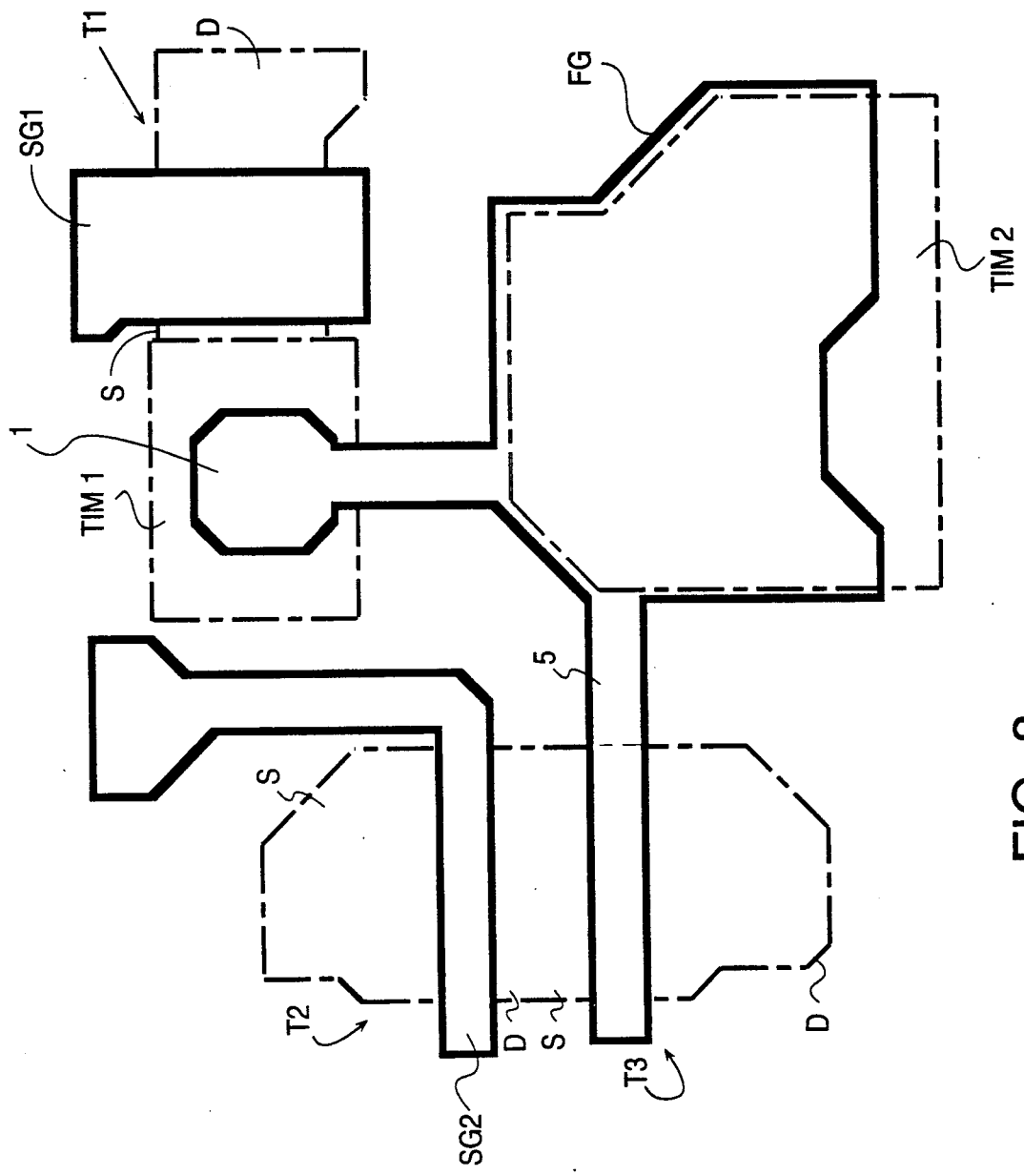
Figure 9:
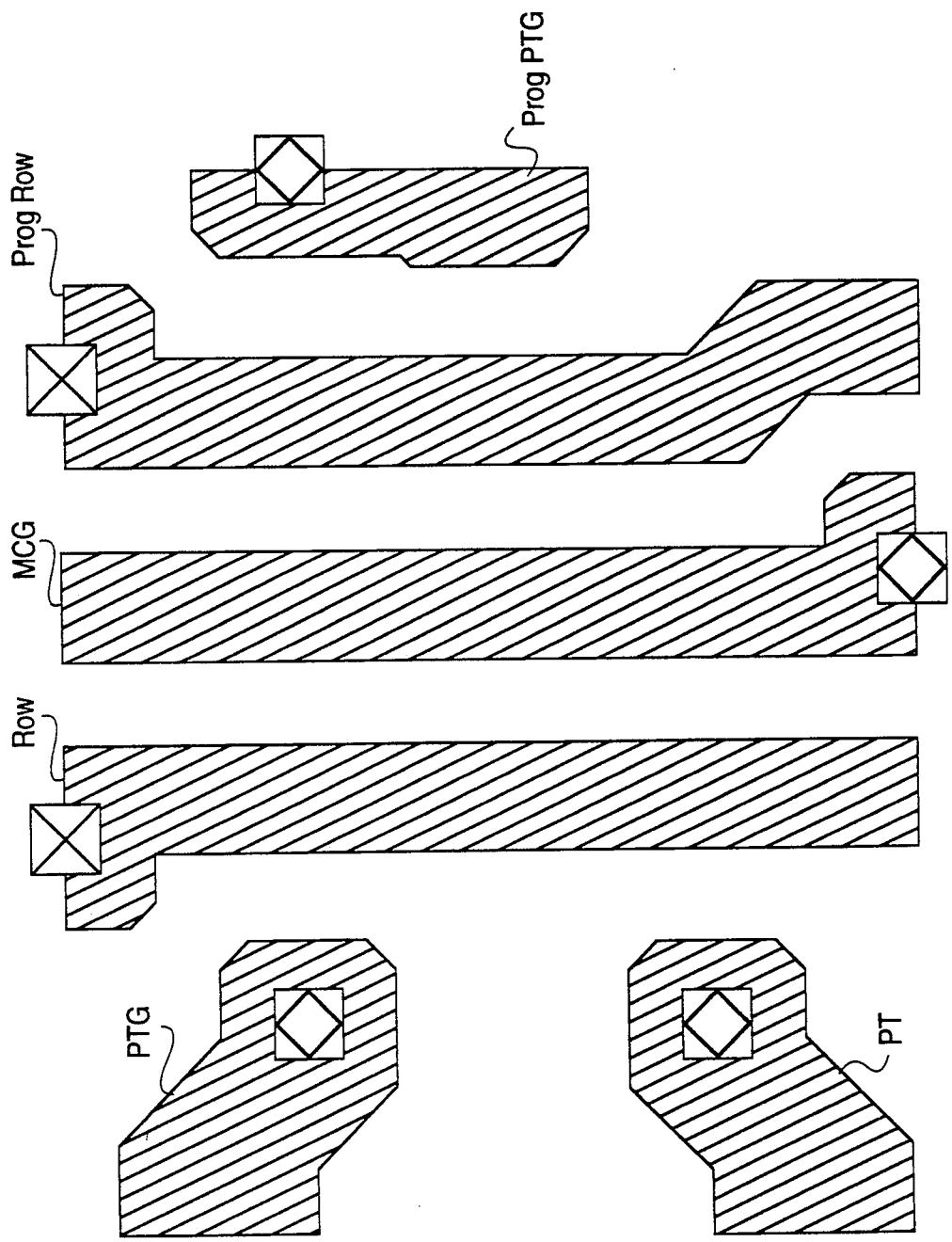
Figure 10:
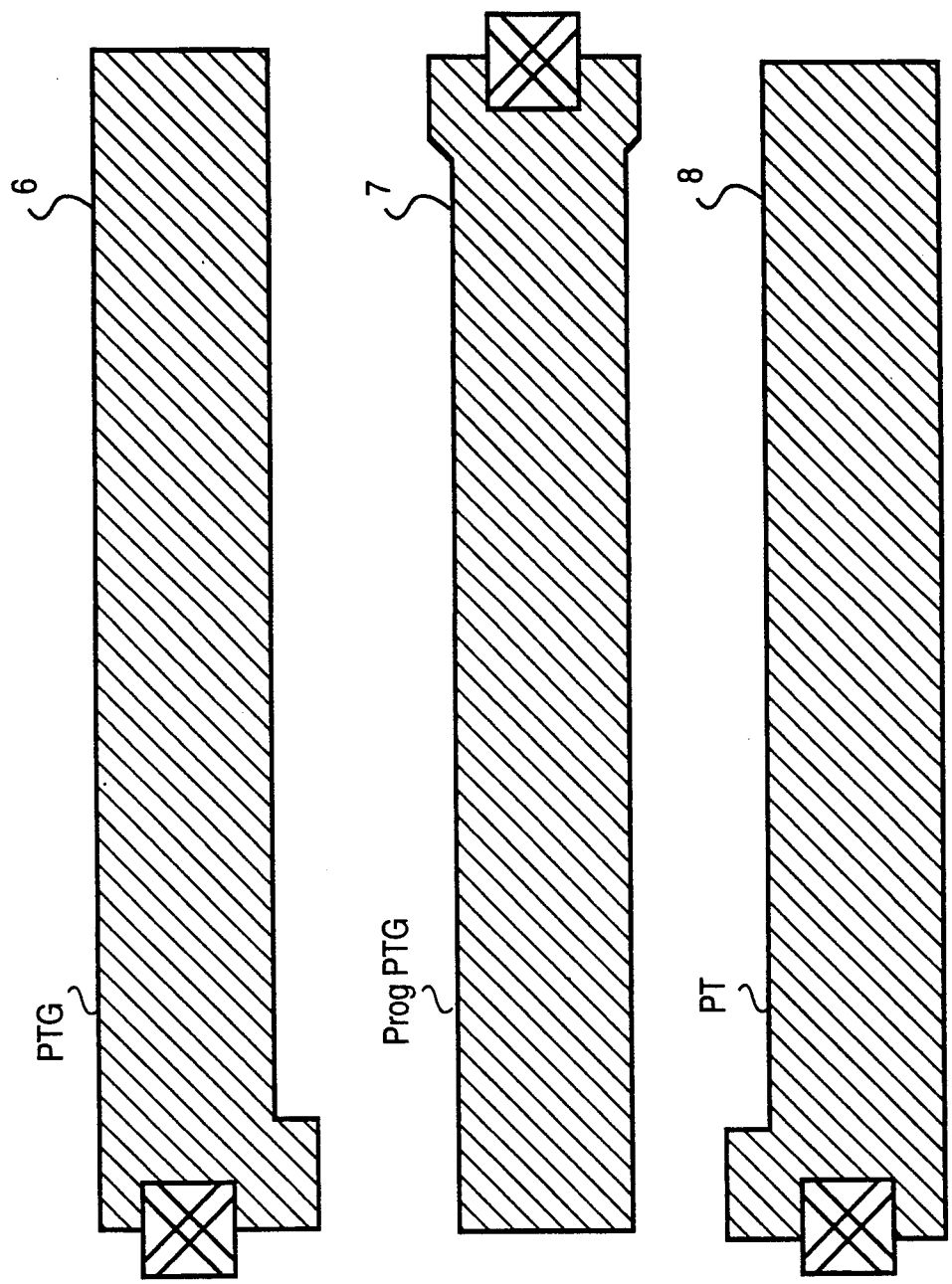
Figure 11:
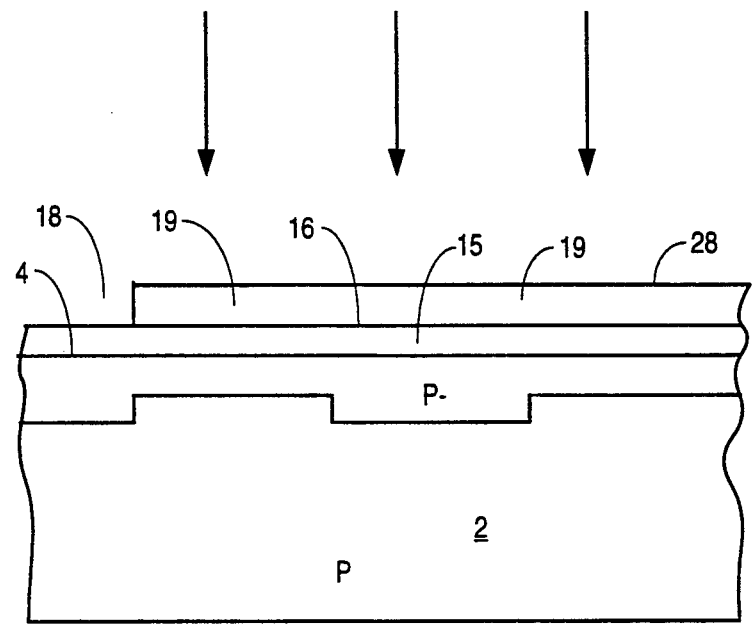

Referring to FIG. 8, the next level in the construction of memory cell MC3 is illustrated. As shown in FIG. 8, write select transistor T1 is indicated in the upper right hand corner, with the source to the left of the select gate 1 (SG1) and the drain to the right of select gate 1 (SG1). The select gate and other gates and memory cell MC3 are preferably polycrystalline silicon. The details of the regions, polycrystalline silicon gates and other features of the memory cell are described in detail hereinafter in the description of the process for producing the cell illustrated with use of FIGS. 11-20. The explanation of FIGS. 5 and 7-10 are for the purpose of a general overall understanding of the layout of the cell and its various features. Also illustrated in FIG. 8 is transistor T2, the read select transistor, the source and drain for which are indicated by an S and a D in the figure. The select gate for read select transistor T2 is indicated by the reference character SG2. Directly below (in the figure) read select transistor T2 is memory transistor T3, the source and drain of which are also indicated by S and D, respectively. Extension 5 of the floating gate controls the conduction, or lack thereof, of memory transistor T3. After the establishment of the active regions and the poly gates as illustrated in FIG. 8, suitable insulation material is provided above the surface of the cell and the first level metal, which is illustrated in FIG. 9, is applied and patterned to provide the layout as illustrated in FIG. 9. First level metallization is utilized to provide connection to the select gate for the read and write transistors T2 and T1 respectively, the contact to diffusion TIM2, all of which are in metallization which is running vertically as oriented in FIG. 9. Smaller segments of first level metal which are indicated with the terms PTG, PT and ProgPTG, are segments of first level metal utilized to make connections to, respectively, the source of transistor T2, the drain of transistor T3 and the drain of transistor T1. Terminals PT, PTG, and ProgPTG are sometimes referred to herein as product term terminals. As will be appreciated by reference to FIG. 10, the product term terminals illustrated in FIG. 9 are connected to second level metal, which is illustrated in detail in FIG. 10. After suitable insulation is provided over the first level metal, second level metal is provided and patterned to the configuration illustrated in FIG. 10. Via holes are provided at the points indicated to connect second level metal to first level metal at the points indicated with the squares having corner to corner double lines included therein. More particularly, in FIG. 10 metallization 6 provides contact to metallization 1 directly below it to provide electrical connection for metallization 6 to the source of transistor T2. Metallization 7 provides contact to the metal 1 layer immediately below it, the metal-to-metal contact point providing electrical connection to the drain of transistor T1. And metallization 8, via the metal-to-metal connection illustrated in FIG. 10 connects to metal 1 directly below it at the indicated point and serves as the electrical connection to the drain of memory transistor T3.

The detail and description of the process of producing memory cell MC3, as mentioned above, is provided hereinafter in FIGS. 11-20. However, from the above description, it will be appreciated that first level metal is used to provide electrical connection to the select gate of the read select transistor and a separate metallization is utilized for connection to the select gate of the write select transistor and further it will be appreciated that second level metal is used to provide connection to product term terminals PT, PTG and ProgPTG. Using this implementation, the disadvantages of the prior art pointed out earlier herein are overcome and the cell operates with increased speed as a result of the reduced capacitance on the product terms (since second level metal is used for the product terms) and with reduced sensitivity during read operations to interference from capacitive coupling between the row and product term lines.

The combined structures illustrated in FIGS. 7 through 10 result in the completed memory cell MC3 that is illustrated in FIG. 5.

Figure 4:
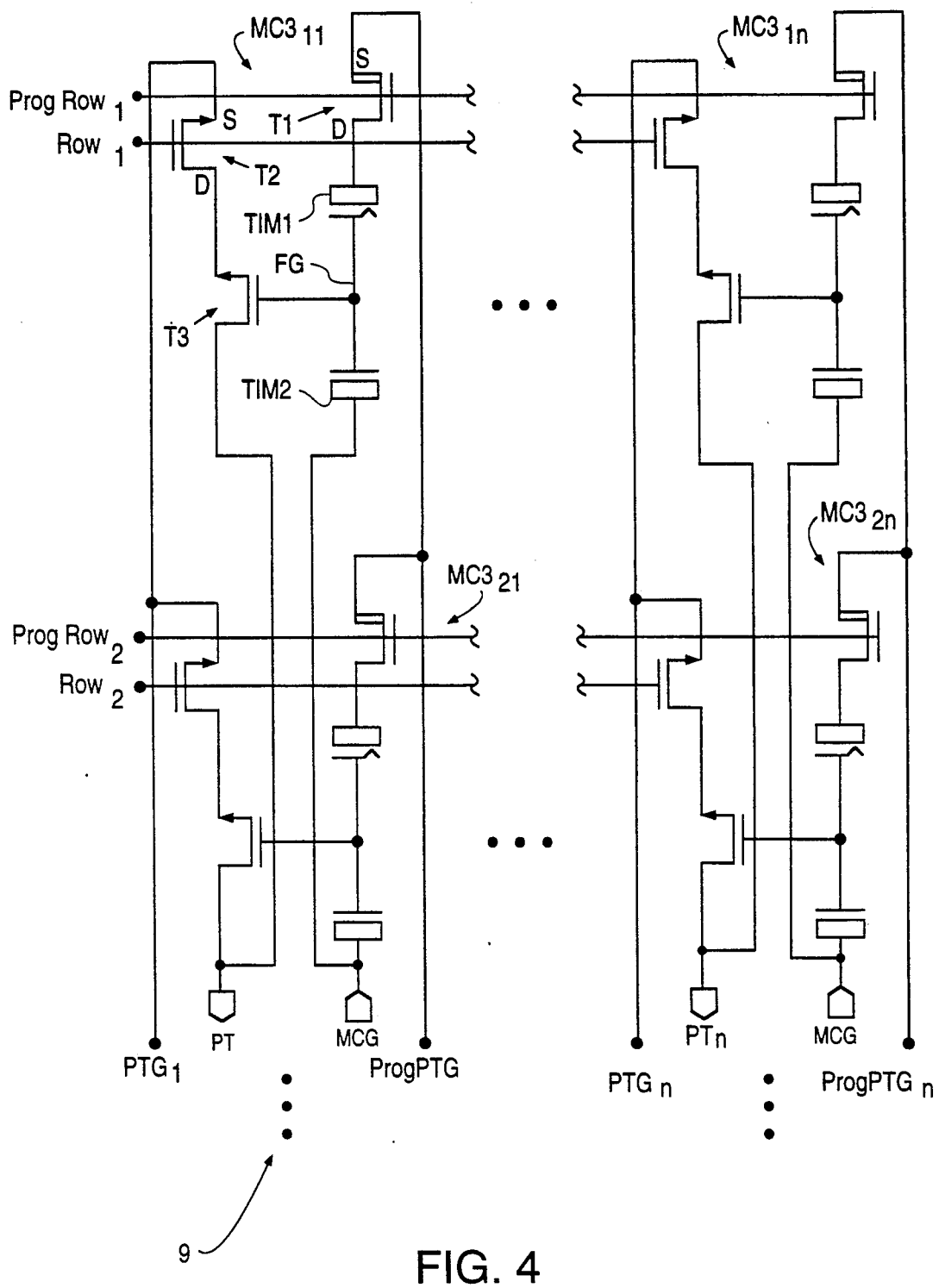
FIG. 4 illustrates schematically a semiconductor memory array utilizing the memory cell in accordance with the present invention.

Referring to FIG. 4, semiconductor memory array 9 is illustrated utilizing memory cells in accordance with the present invention. As will be appreciated by reference to FIG. 4, the array is highly simplified for convenience of illustration and includes only two rows and two columns. However, for the purposes of illustrations the figure is sufficient. In row 1, column 1, memory cell $MC3_{11}$ includes write select transistor T1, read select transistor T2 and memory transistor T3. The same reference characters are utilized in each of the memory cells, this terminology also being consistent with that used for memory cell MC3 and the explanation in connection with FIG. 3. In row 1, memory cell $MC3_{1N}$ represents the last memory cell in the first row. As will be appreciated by reference to array 9, the program select gates for write select transistors T1 in row 1 are connected to $ProgRow_1$, and the read select gates for read select transistors T2 are commonly connected to $Row_1$. Within the first column, the sources of each of the read select transistors T2 are connected in common to terminal PTG1. As is well known to those skilled in the art, when a read operation is to be performed in column 1, a sense amplifier (not shown) coupled to terminal PTG1 senses the conduction, or lack thereof, of the memory transistor T3 which is associated with the selected row. Accordingly, to read the state of memory cell $MC3_{11}$, the voltages indicated in the above table are applied to the terminals for cell $MC3_{11}$ as indicated in the table in the column under Normal, and the programmed or erased state, as the case may be, is determinable by the sense amplifier connected to terminal PTG1. In similar fashion, the programmed or erased state, as the case may be, of each of the memory cells in semiconductor memory array 9 may be determined by the application of appropriate potentials.

The process for producing the memory cell in accordance with the present invention will be described using FIGS. 11-20. As noted previously, all of the semiconductor devices in memory cell MC3 are N-channel devices. The following description is representative of the processes utilized for completing the entire cell. The active areas of the devices are isolated using conventional LOCOS (Localized Oxidation of Silicon). The portion of memory cell MC3 illustrated along lines 11-7 and 11-7 of FIG. 7 will be described in detail. The other semiconductor devices in memory cell MC3 are produced in the same manner, and the description that follows is representative for those areas as well. Beginning with FIG. 11, the process begins by providing substrate 2, which is preferably P-type silicon having a resistivity in a range of 16–24 ohm-cm., with the preferable resistivity being approximately 20 ohm-cm. Surface 4 of substrate 2 is in the <100> crystallographic orientation plane. On surface 4, silicon dioxide is grown in a dry oxygen atmosphere to a thickness of approximately 400 Å to provide first oxide 15. Next, silicon nitride is deposited on the structure, resulting silicon nitride layer 19 adhering to surface 16. Silicon nitride layer 19 is preferably approximately 2000 Å thick and may be deposited by chemical vapor deposition processes well known to those skilled in the art. Following a deposition of silicon nitride layer 19, photoresist is applied to surface 28 and patterned to leave unprotected those portions of layer 19 to be removed, such as the area for the to be formed opening 18. An etch is performed to remove 2000 Å of silicon nitride layer 19 to provide opening 18. The photoresist layer is then removed using conventional processes. Next, a field implant is performed, preferably with boron at a dosage of approximately 6E12 and an energy of 35 KeV. This dosage assumes the use of a substrate bias $V_{BB} = -2.5$ volts. If negative substrate bias is not used, then a higher field implant and punch through implant dose is required. Following the field implant, a punch-through implant, also preferably using boron, is performed at a dosage of 2E12 and at an energy level of 170 KeV.

Figure 12:
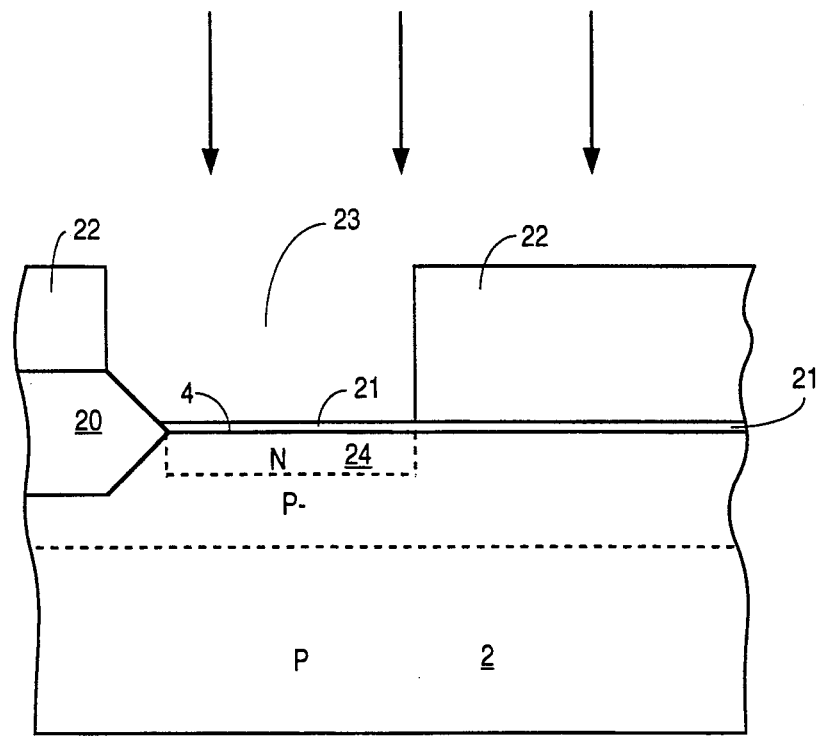

Referring to FIG. 12, field oxide 20 is grown to a thickness of approximately 7000 Å as the preferable thickness, however 5000–10000 Å is an acceptable range. The thicker the field oxide layers, the better the high voltage isolation and the lower the parasitic capacitance will be achieved, however a thicker field oxide area results in larger steps and can produce regions of stress in the silicon with the potential for silicon defects. First oxide 15 and silicon nitride layer 19 above those portions of first oxide 15 are stripped away down to surface 4 of substrate 2, the preferred stripping is accomplished by using a three step etch process comprising (i) 10:1 HF etch for about 80 seconds, followed by (ii) nitride etch using phosphoric acid ($H_3PO_4$) for 80 minutes and (iii) 10:1 HF (dilute hydrofluoric acid) for 150 seconds. Next, sacrificial oxide layer 21 is grown on the whole wafer in preparation for providing tunnel implant TIM (which is FIG. 3 is indicated by TIM1 and TIM2 although it is a singular area as is illustrated in FIG. 7). Tunnel implant TIM (which is an N-type region) serves as a source of electrons, and serves as a conducting plate below since the source drain implants are self-aligned. Sacrificial oxide 21 is preferable silicon dioxide and is grown to a thickness of approximately 400 Å. Sacrificial oxide 21 is preferable grown by the well known dry oxide process, at a temperature of about 1000° C. After sacrificial oxide 21 is grown, photoresist 22 is applied to the surface of the substrate and patterned to provide openings, such as opening 23, where the tunnel implant is desired to be formed. Tunnel implant 24 may be achieved by implanting either phosphorous or arsenic, the one selected is to some extent determined by the thermal cycles which will be used in the back end of the process. If phosphorus is utilized, the preferred dose is 7E13 and the implant energy about 80 KeV. Phosphorus is the preferable implant since a suitable depth may be achieved without requiring a drive-in step. On the other hand, arsenic may alternatively be used with a dose of 5E13 to 1E15 with an implant energy of approximately 170 KeV. With arsenic, a drive-in step in utilized to provide suitable depth to tunnel implant 24.

Figure 13:
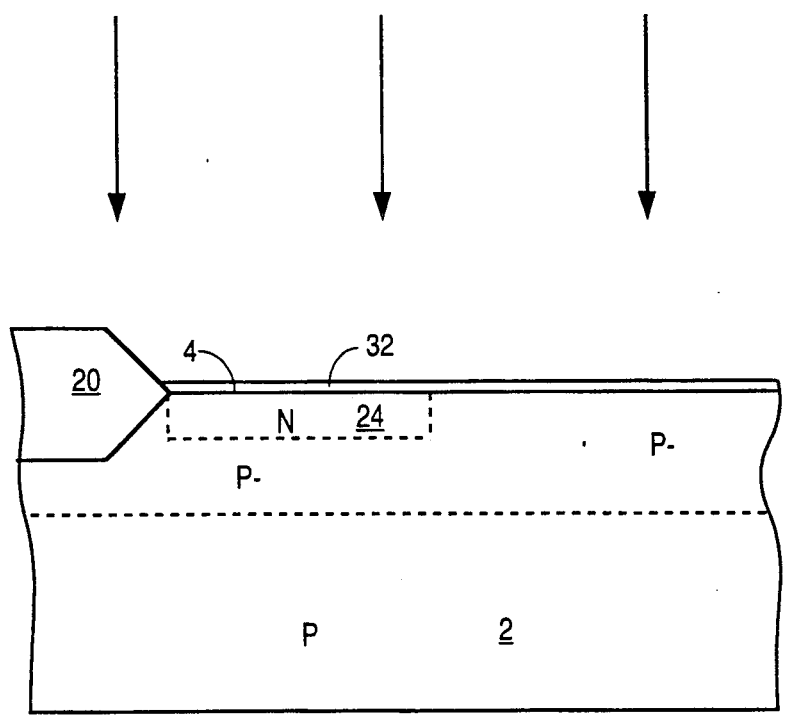

Next an enhancement implant step is performed. Before the enhancement implant step is commenced, sacrificial oxide 21 is removed using a 10:1 mixture of water and hydrofluoric acid for about 150 seconds. Referring to FIG. 13, initial gate oxide 32 is applied to the surface of the substrate to the thickness of approximately 180 Å. Initial gate oxide 32 may be for example silicon dioxide formed by the wet oxide process at 850° C. The enhancement implant is then performed using preferably boron with a dosage of 3.5E11 with an implant energy of 35 KeV.

Figure 14:
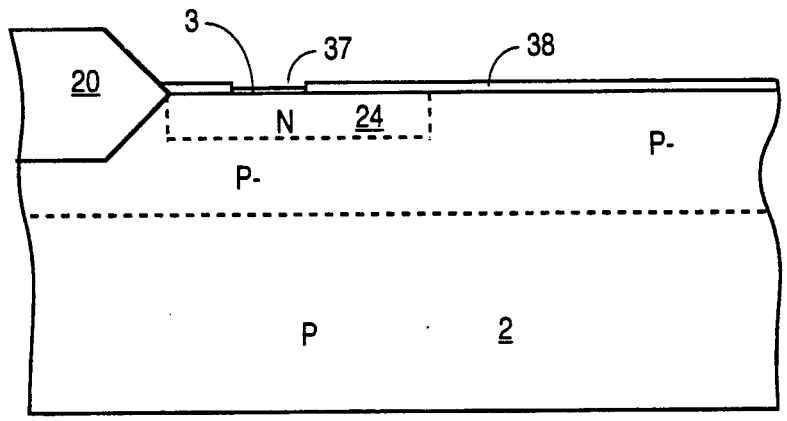

Next, the tunnel oxide which is used in the programming and erasing of floating gate FG is established on surface 4 of substrate 2 in an area above a portion of tunnel implant 24. The location of tunnel oxide 3 is illustrated in plan view in FIG. 7, and is illustrated in the cross-sectional view of FIG. 14. Before tunnel oxide 3 is formed, photoresist is applied to the surface of the device, and patterned to define opening 37 at the desired location for the to be formed tunnel oxide 3. The edge of opening 37 should be at least 0.5 $\mu$m away from the edge of field oxide 20 in order to achieve a high quality tunnel oxide. After defining tunnel opening 37, initial gate oxide 32 is etched to surface 4 using plasma or wet chemical (if wet chemical, preferably hydrofluoric acid buffered oxide etch). The photoresist is not shown in FIG. 14, however it will be appreciated by those skilled in the art that patterning as known is performed to establish opening 37 at the desired location. After opening 37 is etched down to surface 4, the photoresist is then removed and a thin tunnel oxide 3 is grown to a thickness of approximately 90 Å (FIG. 14). Initial gate oxide 32 increases its thickness in this process, and grows to an increased thickness forming final gate oxide 38. The thickness of initial gate oxide 32 is determined by the final desired thickness for final gate oxide 38 approximately 225 Å thick. Since the tunnel opening is etched to surface 4, and the desired thickness for tunnel oxide 3 is know, the final gate oxide thickness will be a combination of the initial gate oxide thickness, plus the growth amount added to initial gate oxide 32 during the formation of tunnel oxide 3.

Figure 15:
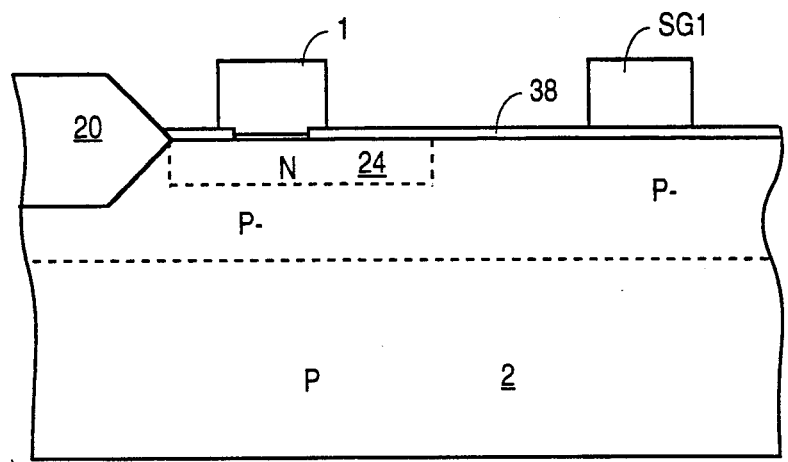

After completion of the growth of tunnel oxide and the establishment of final gate oxide 38, the structure is placed in a CVD chamber and polycrystalline silicon is deposited to a thickness of approximately 4000 Å. The poly crystalline silicon layer is doped using a conventional $POCl_3$ diffusion at 900° C. for about 40 minutes. Suitable photoresist is applied, then patterned and etched to establish the select gates, the floating gate, which includes portion 1 (for programming and erasing) and portion 5 (which is the gate for transistor T3), all of which are illustrated in FIGS. 5 and 8. In the cross-sectional view in FIG. 15, select gate SG1 for write select transistor T1 is illustrated, as well as is extension 1 from floating gate FG which extension as is illustrated in FIG. 15 illustrates tunnel oxide 3, as well as a portion of final gate oxide 38.

Figure 16:
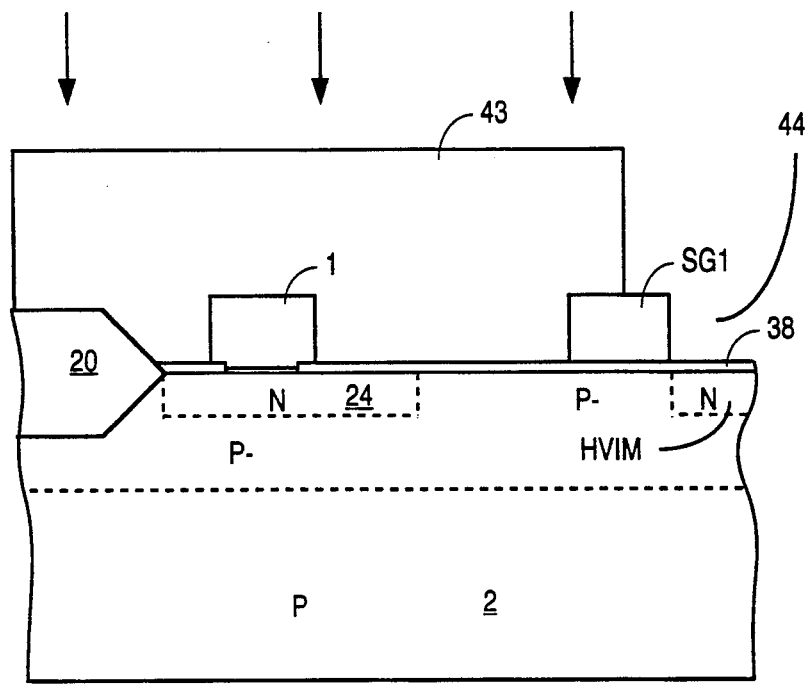
Figure 17:
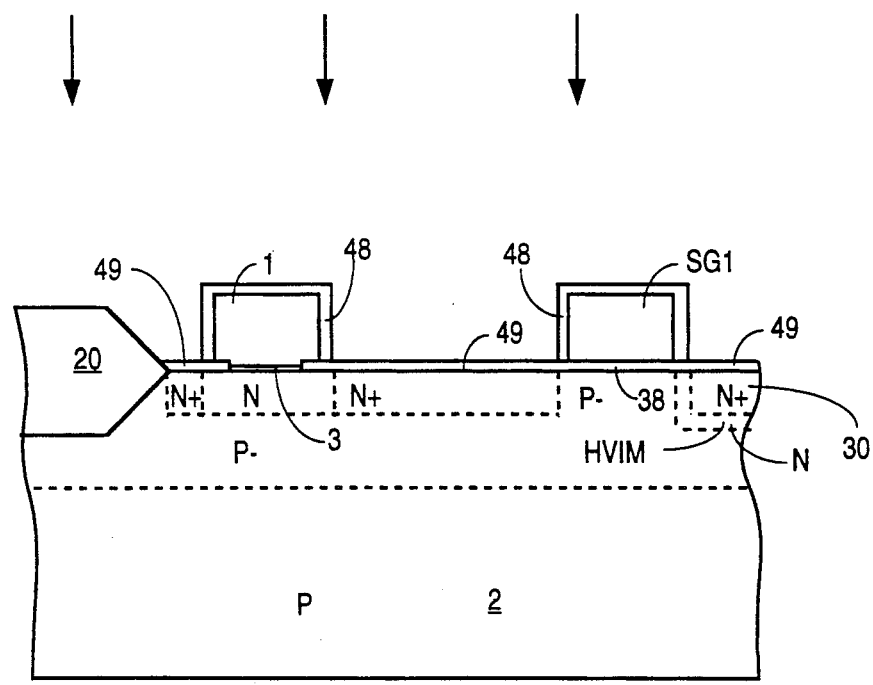

High voltage implant HVIM (which is illustrated in FIG. 7) is positioned below the to be formed drain of write select transistor T1. High voltage implant HVIM is also known in the art as a TIP implant, and increases the voltage blocking of the drain of transistor T1. In other words, it allows the placement of a higher voltage on the drain of write select transistor T1 than would otherwise be possible. The process for forming high voltage implant HVIM will be best appreciated by reference to FIG. 16. Photoresist 43 is applied to the surface of the structure and patterned to provide openings, one of which is illustrated at 44 at the locations where high voltage implant HVIM is desired. The implant is performed preferably using phosphorus at a dosage of 2E14, with an implant energy of 40 KeV. Although the dosage rate of 2E14 is preferred, a dosage in the range of 5E13 to 5E14 could alternatively be utilized. FIG. 16 illustrates the structure having high voltage implant HVIM formed to the right of select gate SG1. After high voltage implant in FIG. 16 is completed, photoresist 43 is stripped away in preparation for growth of a thermal oxide over the structure. Referring to FIG. 17, thermal oxide 48 is grown in a dry oxygen atmosphere at 1000° C. for approximately 20 minutes. This heat step also drives in high voltage implant HVIM. This process provides an additional 250 Å of silicon dioxide to the uncovered portions of gate oxide 38, thus yielding oxide 49 having a thickness of about 350 Å. Since thermal oxide grows more quickly over polysilicon, thermal oxide 48 in the areas indicated which are above gates SG1 and portion 1 of floating gate FG will become approximately 500 Å–1000Å thick. Thermal oxide 48 serves to totally seal the polysilicon on the memory cell and provides a good electrically insulative layer over the various polysilicon structures. Following the thermal oxide step, an N+ source and drain implant, using a double diffusion implant process is performed. In the first implant, phosphorous is implanted at a dosage of 1.4E14 at an energy of 80 KeV. Following the phosphorous implant, arsenic at a dosage of 4E15 and an energy of 80 KeV is performed. The resulting structure is illustrated in FIG. 17, with N+ indicating the source/drain implants.

Figure 18:
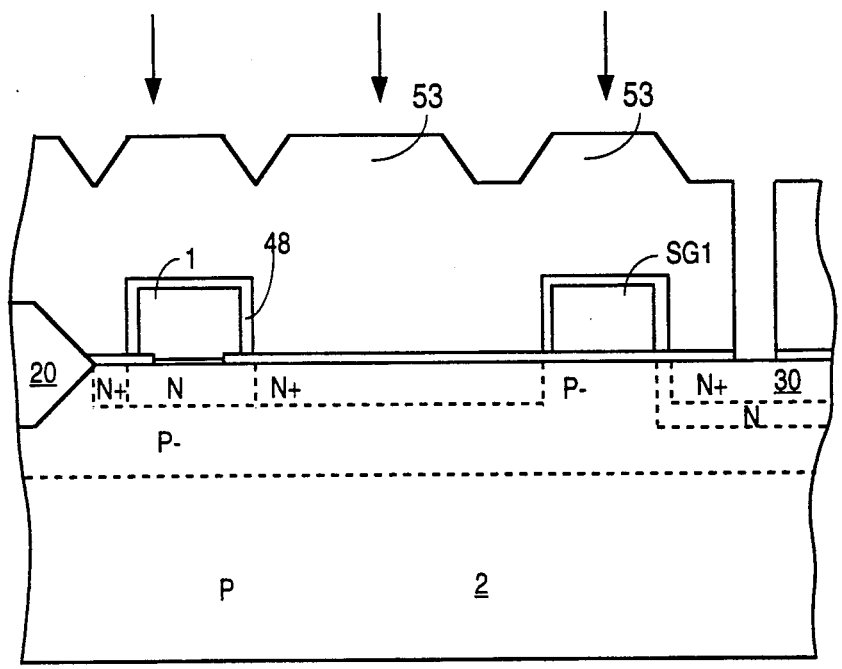
Figure 19:
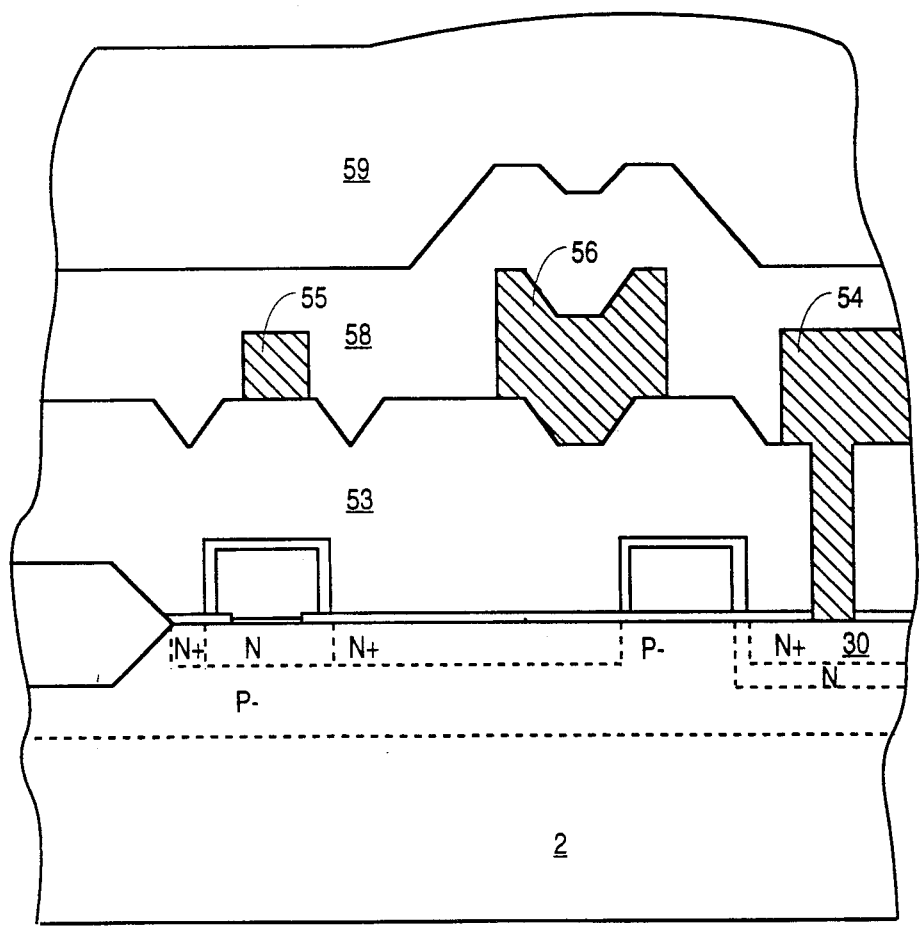
Figure 20:
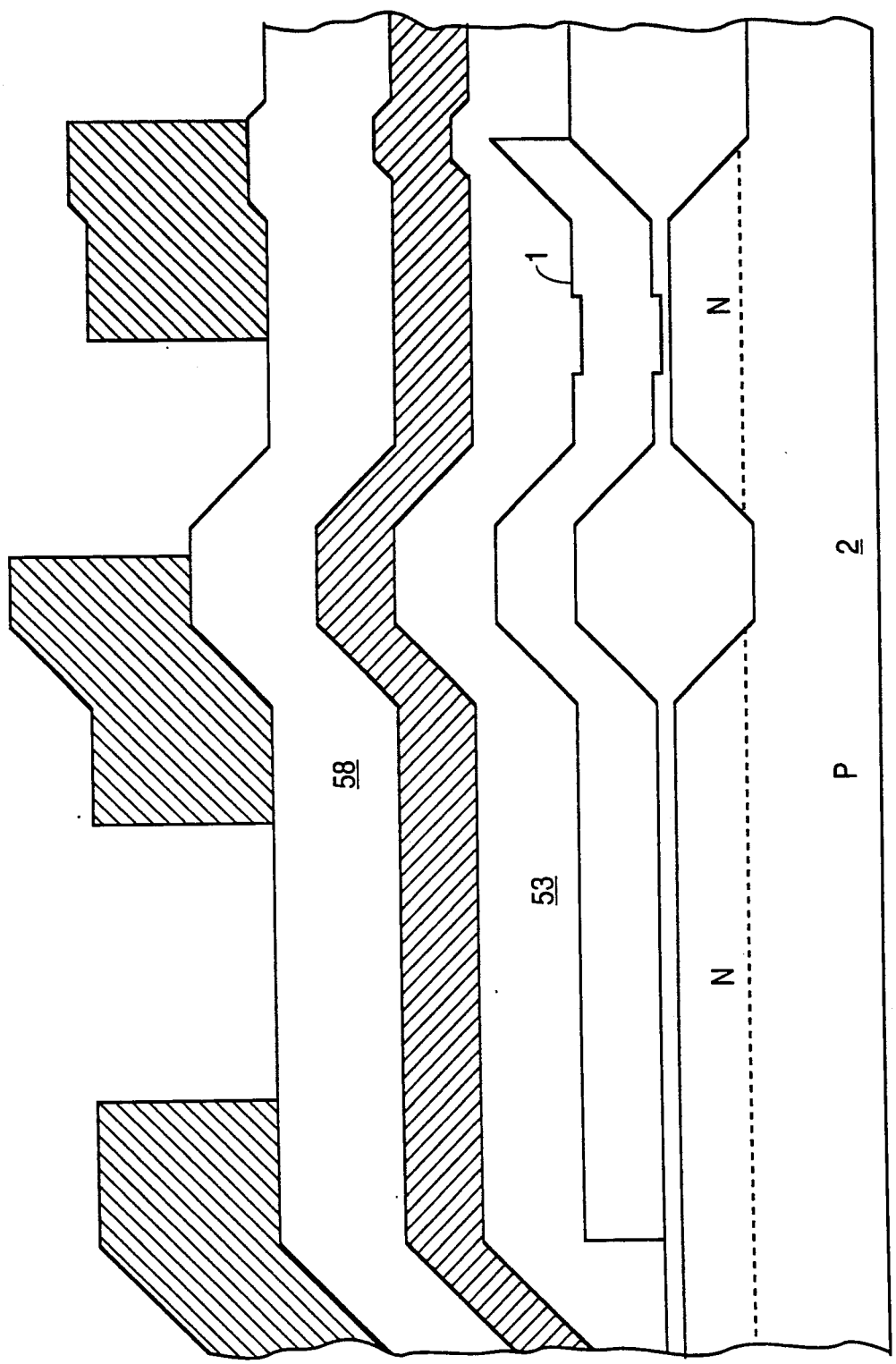

Following the N+ source/drain implants described above, a source/drain oxidation step is performed at about 830° C. for twenty minutes in wet oxygen. Turning to FIG. 18, first dielectric 53 is deposited using a low temperature oxide (LTO) process with low pressure chemical vapor deposition (LPVD) equipment. First dielectric 53 is comprised of 2000 Å of NSG (undoped oxide), followed by 2000 Å of PSG (phosphorus doped oxide), which is then followed by 1000 Å of SOG (spin on glass). After first dielectric 53 is deposited, a furnace diffusion step is performed at 800° C. for twenty minutes, followed by a halogen lamp anneal at 1040° C. for 10 seconds. Next, photoresist is applied and patterned to leave exposed the areas of first dielectric 53 to be removed to provide openings to the diffusions to be contacted. Reactive ion etching is next performed to remove the unprotected portions of first dielectric 53 down to surface 4 of substrate 2. A contact enhancing N-doped implant is performed utilizing phosphorus at a dosage of 4E15 at an implant energy of 70 KeV. This implant is performed in preparation for, in this figure,

We claim:

1. An electrically erasable and programmable semiconductor memory array in a body of semiconductor material, said array comprising:
  a plurality of semiconductor memory cells fabricated with a single layer of polycrystalline silicon arranged in rows and columns along a surface of said body, each of said memory cells comprising an electrically programmable and erasable transistor, a read select transistor coupled to said programmable transistor, said read select transistor including a read select gate for controlling the conduction of said read select transistor, a write select transistor coupled to said programmable transistor, said write select transistor including a write select gate for controlling the conduction of said write select transistor;
  a plurality of first electrically conductive members, each associated with a respective single row of said rows of memory cells and connected to the read select gates of the memory cells in its respective single row; and
  a plurality of second electrically conductive members, each associated with a respective single row of said rows of memory cells and connected to the write select gates of the memory cells in its respective single row, whereby a first electrical potential is applied to the read select gates of each of said rows of memory cells independently of a second electrical potential applied to the write select gates of each of said rows of memory cells
  wherein said body of semiconductor material is of a first conductivity type, said read select transistors and write select transistors are defined by regions of a second conductivity type extending into said body from said surface, said array further comprising third electrically conductive members, each having a first level portion for providing electrical connection to said regions of semiconductor material of second conductivity type and a second level portion connected to said first level portion, said second level portion extending substantially parallel to said surface, wherein said first and second electrically conductive members are spaced intermediate said surface of said body and said second level portion of said third electrically conductive members.

2. The array according to claim 1, wherein said first and second electrically conductive members are comprised of metallic conductors.

3. The array according to claim 2, wherein said read select gates and said write select gates are comprised of polycrystalline silicon.

4. The array according to claim 1, wherein said electrically programmable and erasable transistor is comprised of:
  first and second semiconductor regions of a second conductivity type extending into said body from said surface, said first and second regions having edges positioned in spaced apart relationship defining a channel therebetween which extends to said surface;
  a third region of said second conductivity type extending into said body from said surface, said third region being spaced apart from said first region, said second region, and said channel; and
  a floating gate positioned above and insulated from said surface, said floating gate having a first portion extending above said channel and a second portion extending above said third region.

* * * * *